(12) United States Patent
Wang et al.

(10) Patent No.: US 7,965,458 B2
(45) Date of Patent: Jun. 21, 2011

(54) CLUTCHING JIG

(75) Inventors: Chin-Chou Wang, Taipei (TW); Yi-Chang Yang, Taipei (TW)

(73) Assignee: Cheng Uei Precision Industry Co., Ltd, Taipei (TW)

( * ) Notice: Subject to any disclaimer, the term of this patent is extended or adjusted under 35 U.S.C. 154(b) by 175 days.

(21) Appl. No.: 12/491,606

(22) Filed: Jun. 25, 2009

(65) Prior Publication Data

US 2010/0328792 A1 Dec. 30, 2010

(51) Int. Cl.
G02B 7/02 (2006.01)
(52) U.S. Cl. .................................. 359/827; 359/811
(58) Field of Classification Search .................. 359/811, 359/819, 827; 385/88, 89, 92, 93; 29/278, 29/700, 764, 770
See application file for complete search history.

(56) References Cited

U.S. PATENT DOCUMENTS

| | | | | |
|---|---|---|---|---|
| 5,452,388 A | * | 9/1995 | Rittle et al. | 385/92 |
| 6,086,263 A | * | 7/2000 | Selli et al. | 385/88 |
| 7,707,712 B2 | * | 5/2010 | Kim | 29/832 |

* cited by examiner

*Primary Examiner* — Loha Ben
(74) *Attorney, Agent, or Firm* — WPAT, P.C.; Anthony King

(57) ABSTRACT

A clutching jig used to disengage a lens socket and a lens component which has a base glued on a printed circuit board (PCB) and is fixed in the lens socket by a plurality of buckling pieces of the lens socket abutting on the lens component. The clutching jig defines a base plate. The base plate has an inserting hole at a middle portion thereof. A side of the base plate has a portion surrounding the inserting hole extended perpendicular to the base plate to form a plurality of inserting slices, enclosing a chamber for receiving the lens component. The inserting slices are adapted to insert into a gap between the lens component and the lens socket for pressing the buckling pieces away from the lens component, with distal ends of the inserting slices extending inwards beyond a junction of the base and the PCB.

7 Claims, 3 Drawing Sheets

CLUTCHING JIG

BACKGROUND OF THE INVENTION

1. Field of the Invention

The invention relates to a clutching jig, and more particularly to a clutching jig for disengaging a lens component from a lens socket.

2. The Related Art

Please refer to FIGS. 3-4, a lens module includes a lens component 20 and a lens socket 30 coupled with the lens component 20. The lens component 20 has a rectangular base 21 glued on a printed circuit board (PCB) 23 and a round lens body 22 disposed on the base 21. The base 21 is formed with four receiving grooves 211 at four corners thereof. The lens body 22 has a fool-proof projection 221 extended outwards from a side thereof. The lens socket 30 has an insulating housing 31 and a metal shell 32 enclosing a periphery of the insulating housing 31. The metal shell 32 is provided with buckling pieces 321, 322 at upper portions thereof. The buckling pieces 321, 322 are bent inwards to abut against bottoms of the corresponding receiving grooves 211 for preventing lens component 20 from removing out of the lens socket 30, and lean against the sides of the base 21 for preventing the lens component 20 from moving with respect to the lens socket 30.

Nevertheless, as the PCB 23 and the base 21 may have a relative movement therebetween or the glue adapted for connecting with the PCB 23 and the base 21 is extruded to overflow and coagulate to form overflowing lumps attached to the outer sides of the PCB 23 or the base 21. In the process of disassembly, the lens component 20 can not be disengaged from the lens socket 30 because the buckling pieces 321, 322 rest against the projecting portion of the PCB 23 or the overflowing lumps. Therefore, it is desirable to design a clutching jig which has a simple structure and is capable of addressing the problem mentioned above.

SUMMARY OF THE INVENTION

An object of the present invention is to provide a clutching jig for disengaging a lens socket from a lens component which has a base glued on a printed circuit board (PCB) and is fixed in the lens socket by a plurality of buckling pieces of the lens socket abutting on the lens component. The clutching jig defines a base plate. The base plate has an inserting hole at a middle portion thereof. A side of the base plate has a portion surrounding the inserting hole extended perpendicular to the base plate to form a plurality of inserting slices, enclosing a chamber for receiving the lens component. The inserting slices are adapted to insert into a gap between the lens component and the lens socket for pressing the buckling pieces away from the lens component, with distal ends of the inserting slices extending inwards beyond a junction of the base and the PCB.

As described above, the inserting slices inserted into the gap between the lens component and the lens socket substantially surround the whole periphery of the base of the lens component and extend inwards beyond the junction of the lens component and the PCB. When the clutching jig is used to disengage the lens component from the lens socket, the lens component is easily released from the fastening of the buckling pieces of the lens socket. So the lens component can be conveniently clutched out of the lens socket by other jig device.

BRIEF DESCRIPTION OF THE DRAWINGS

The present invention will be apparent to those skilled in the art by reading the following description of an embodiment thereof, with reference to the attached drawings, in which.

DETAILED DESCRIPTION OF THE PREFERRED EMBODIMENT

Figure 1:
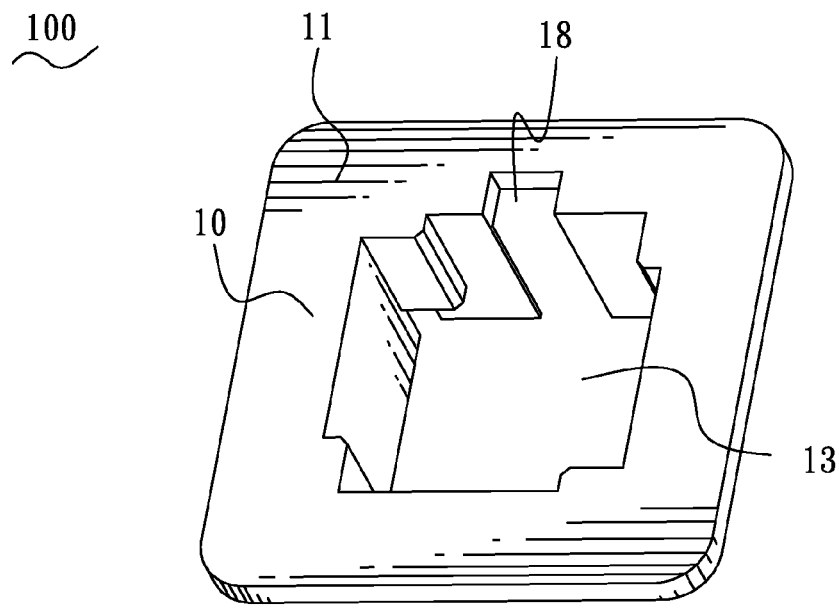
FIG. 1 is a perspective view of a clutching jig according to the present invention.
Figure 2:
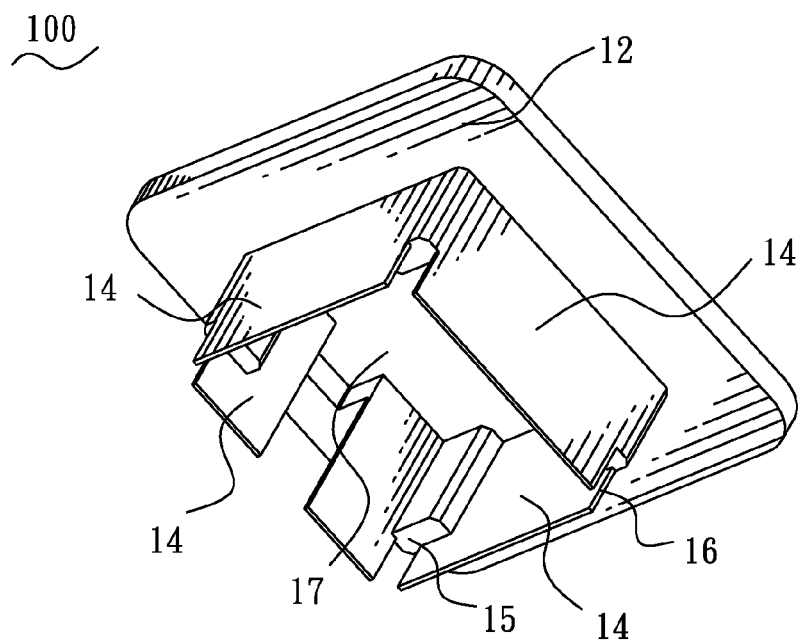
FIG. 2 is a perspective view of the clutching jig shown in FIG. 1 seen from another direction.
Figure 3:
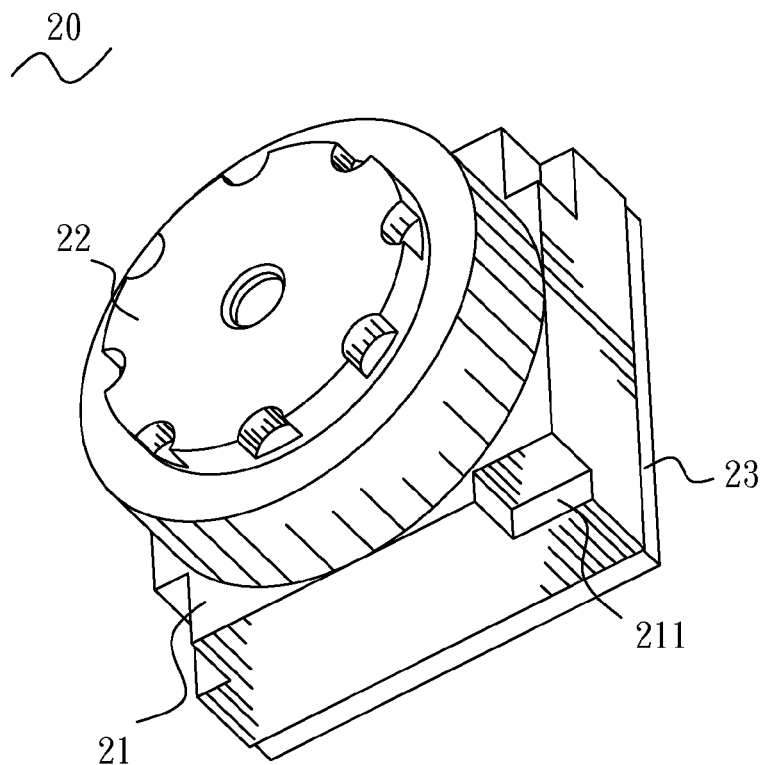
FIG. 3 is a perspective view of a conventional lens component.
Figure 4:
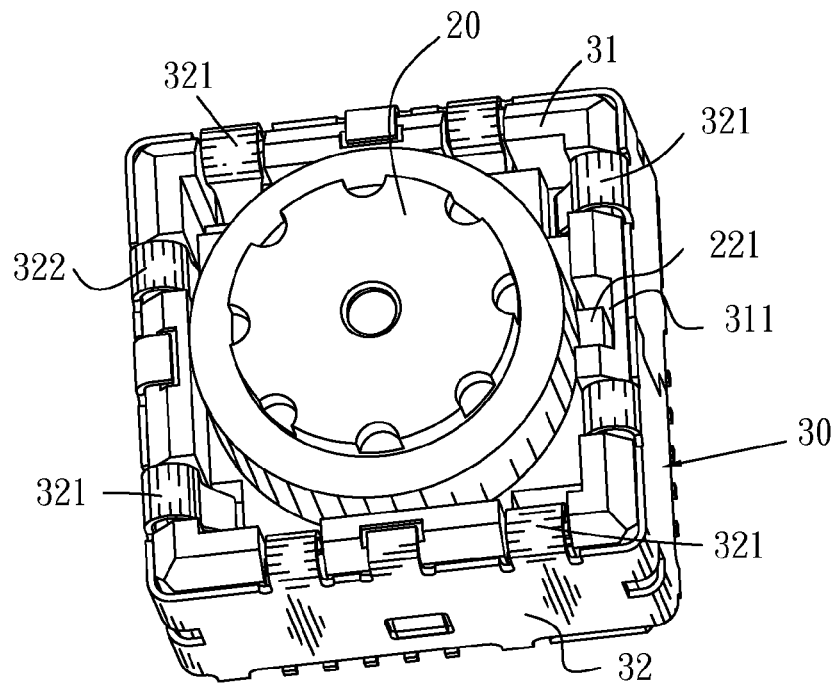
FIG. 4 is a perspective view of a lens module which includes the lens component shown in FIG. 3 and a lens socket.
Figure 5:
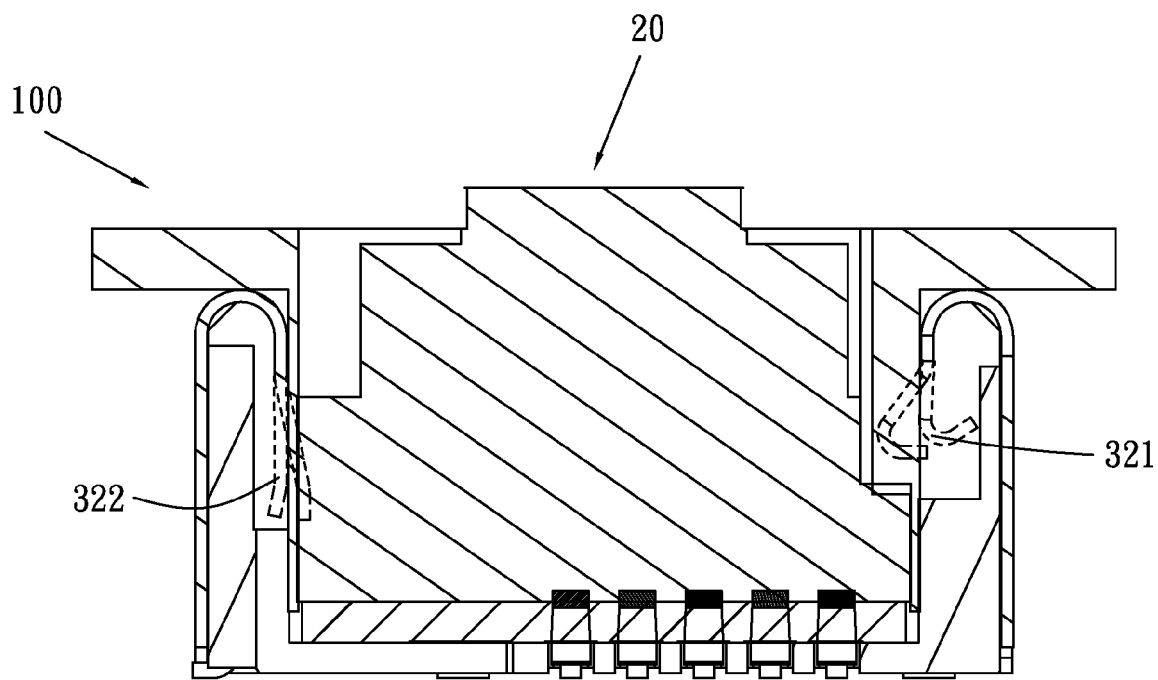
FIG. 5 is a cross-sectional view showing the state that the clutching jig shown in FIG. 1 is inserted into the lens module shown in FIG. 4.

Referring to FIGS. 1-2, a clutching jig 100 according to the present invention is shown. The clutching jig 100 has a rectangular base plate 10, with a top surface 11 and a bottom surface 12 defined thereon. The base plate 10 is formed with a rectangular inserting hole 13 at a middle portion thereof. The bottom surface 12 of the base plate 10 has a portion extended downwards to form four inserting slices 14 for enclosing the inserting hole 13. The four connected inserting slices 14 are formed with a receiving chamber 17 thereamong with a shape capable of mating with the shape of the base 21 of the lens component 20. In this embodiment, a peripheral shape of the receiving chamber 17 is rectangular. The inserting slices 14 are inserted into a gap between the lens component 20 and the lens socket 30 for pressing the buckling pieces 321, 322 apart from the lens component 20. Inner surfaces of the inserting slices 14 are flush with inner edges of the inserting hole 13. An upper portion of each corner of the chamber 17 has a protrusion 15 attached to the two contiguous inserting slices 14 for strengthening the structure formed by the inserting slices 14. In this embodiment, the protrusion 15 is protruded inwards from the two contiguous inserting slices 14 and extended upwards and downwards, reaching the top surface 11 of the base plate 10. A lower portion of the each corner of the chamber 17 has a notch 16. In this embodiment, each notch 16 is formed between the two contiguous inserting slices 14 to make the inserting slices 14 move in a limited range and is convenient for the inserting slices 14 to insert into the gap between the lens component 20 and the lens socket 30. A side of the inserting hole 13 has a fool-proof recess 18 passing through the top surface 11 and the corresponding inserting slice 14 receiving the fool-proof projection 221 of the lens component 20 for guiding insertion of the clutching jig 100.

Referring to FIGS. 1-5, when the clutching jig 100 is used to disengage the lens component 20 from the lens socket 30, the clutching jig 100 is firstly adjusted and positioned by the fool-proof projection 221 inserted into the fool-proof recess 18. The lens body 22 is received in the inserting hole 13. The inserting slices 14 are inserted into the gap between the lens component 20 and the lens socket 30 and push the buckling pieces 321, 322 abutting on the bottom of the receiving grooves 211 away from the lens component 20. In this embodiment, the length of the inserting slices 14 is substantially the same as the depth of a chamber of the insulating housing 31. That is, when the clutching jig 100 is inserted into the lens module, distal ends of the inserting slices 14 extend inwards beyond a junction of the base 21 and the PCB 23, which prevents the buckling pieces 321, 322 from abutting the overflowing lumps or the projecting portion of the PCB 23. Thus, the lens component 20 will be released from the buckling pieces 321, 322 of the lens socket 30 and can be disengaged from the lens socket 30 by other jig device.

As describe above, the inserting slices 14 inserted into the gap between the lens component 20 and the lens socket 30 substantially surround on the whole periphery of the lens component 20, with the distal ends thereof extending inwards beyond the junction of the base 21 and the PCB 23. When the clutching jig 100 is used to disengage the lens component 20 from the lens socket 30, the lens component 20 is easily released from the fastening of the buckling pieces 321, 322 of the lens socket 30. So the lens component 20 can be conveniently clutched out of the lens socket by other jig device.

Furthermore, the present invention is not limited to the embodiment described above; various additions, alterations and the like may be made within the scope of the present invention by a person skilled in the art. For example, respective embodiments may be appropriately combined.

What is claimed is:

1. A clutching jig used to disengage a lens socket from a lens component which has a base glued on a printed circuit board (PCB) and is fixed in the lens socket by a plurality of buckling pieces of the lens socket abutting on the lens component, comprising:
    a base plate, the base plate having an inserting hole at a middle thereof, a side of the base plate having a portion surrounding the inserting hole extending perpendicular to the base plate to form a plurality of inserting slices, enclosing a chamber for receiving the lens component, the inserting slices being adapted to insert into a gap between the lens component and the lens socket for pressing the buckling pieces away from the lens component, with distal ends of the inserting slices extending inwards beyond a junction of the base and the PCB.

2. The clutching jig as claimed in claim 1, wherein the inserting hole is rectangular, the inserting slices are connected with one another to form the chamber of which the peripheral shape is rectangular.

3. The clutching jig as claimed in claim 2, wherein an upper portion of each corner of the chamber is protruded inwards to form a protrusion for reinforcing the strength of the structure formed by the inserting slices.

4. The clutching jig as claimed in claim 3, wherein the protrusion extends upwards and downwards and reaches a top surface of the base plate.

5. The clutching jig as claimed in claim 2, wherein a lower portion of the each corner of the chamber has a notch which makes the inserting slices have a proper movement in a certain range and is convenient for the inserting slices inserting into the gap between the lens component and the lens socket.

6. The clutching jig as claimed in claim 1, wherein a side of the inserting hole has a fool-proof recess, passing through a top surface of a base plate and the corresponding inserting slice.

7. The clutching jig as claimed in claim 1, wherein an inner surface of each inserting slice is substantially flush with an inner edge of the inserting hole.

\* \* \* \* \*